United States Patent
Seong et al.

(10) Patent No.: US 10,424,828 B2
(45) Date of Patent: Sep. 24, 2019

(54) COMPOSITE FERRITE MAGNETIC FIELD SHIELDING SHEET, METHOD FOR MANUFACTURING SAME, AND ANTENNA MODULE USING SAME

(71) Applicant: EMW CO., LTD., Incheon (KR)

(72) Inventors: Won Mo Seong, Gyeonggi-do (KR); In Seung Baek, Gyeonggi-do (KR)

(73) Assignee: EMW CO., LTD., Incheon (KR)

( * ) Notice: Subject to any disclaimer, the term of this patent is extended or adjusted under 35 U.S.C. 154(b) by 0 days.

(21) Appl. No.: 15/773,272

(22) PCT Filed: Oct. 24, 2016

(86) PCT No.: PCT/KR2016/011960
§ 371 (c)(1),
(2) Date: May 3, 2018

(87) PCT Pub. No.: WO2017/082553
PCT Pub. Date: May 18, 2017

(65) Prior Publication Data
US 2018/0323494 A1    Nov. 8, 2018

(30) Foreign Application Priority Data
Nov. 11, 2015 (KR) .................. 10-2015-0158375

(51) Int. Cl.
| | | |
|---|---|---|
| H01Q 1/24 | (2006.01) | |
| H01Q 7/00 | (2006.01) | |
| H01F 1/16 | (2006.01) | |
| H01Q 1/52 | (2006.01) | |
| H02J 7/02 | (2016.01) | |
| H05K 9/00 | (2006.01) | |
| H04B 5/00 | (2006.01) | |
| H01F 1/37 | (2006.01) | |
| H02J 50/10 | (2016.01) | |
| H02J 50/12 | (2016.01) | |

(52) U.S. Cl.
CPC .............. *H01Q 1/24* (2013.01); *H01F 1/16* (2013.01); *H01F 1/37* (2013.01); *H01Q 1/521* (2013.01); *H01Q 7/00* (2013.01); *H02J 7/025* (2013.01); *H04B 5/0075* (2013.01); *H05K 9/0081* (2013.01); *H02J 50/10* (2016.02); *H02J 50/12* (2016.02)

(58) Field of Classification Search
CPC .. H01Q 1/521; H01Q 7/00; H01F 1/16; H02J 7/025; H02J 50/10; H04B 5/0075; H05K 9/0081
See application file for complete search history.

(56) References Cited

FOREIGN PATENT DOCUMENTS

| | | |
|---|---|---|
| JP | 2008-103691 A | 5/2008 |
| KR | 10-2006-0102283 A | 9/2006 |
| KR | 10-2010-0086308 A | 7/2010 |

(Continued)

OTHER PUBLICATIONS

International Search Report for PCT/KR2016/011960.

*Primary Examiner* — Graham P Smith
(74) *Attorney, Agent, or Firm* — The PL Law Group, PLLC

(57) ABSTRACT

A composite ferrite magnetic field shielding sheet is divided into at least two regions. The at least two regions have different properties by adjusting raw ferrite particles suitable for forming at least two functional coil patterns from among wireless power charging (WPC), near field wireless communication (NFC), and magnetic security transmission (MST) coil patterns.

21 Claims, 5 Drawing Sheets

(56) References Cited

FOREIGN PATENT DOCUMENTS

| KR | 10-2012-0008332 A | 1/2012 |
| KR | 10-2013-0125915 A | 11/2013 |
| KR | 10-2015-0076143 A | 7/2015 |

APPLY MAGNETIC FIELD

COMPOSITE FERRITE MAGNETIC FIELD SHIELDING SHEET, METHOD FOR MANUFACTURING SAME, AND ANTENNA MODULE USING SAME

CROSS REFERENCE TO RELATED APPLICATIONS AND CLAIM OF PRIORITY

This application claims benefit under 35 U.S.C. 119(e), 120, 121, or 365(c), and is a National Stage entry from International Application No. PCT/KR2016/011960, filed Oct. 24, 2016, which claims priority to the benefit of Korean Patent Application No. 10-2015-0158375 filed in the Korean Intellectual Property Office on Nov. 11, 2015, the entire contents of which are incorporated herein by reference.

TECHNICAL FIELD

The present invention relates to a composite ferrite magnetic field shielding sheet, a method of manufacturing the same, and an antenna module using the same, and more specifically, to a technology for a composite ferrite magnetic field shielding sheet which is divided into at least two regions having different properties by adjusting raw ferrite particles suitable for forming at least two functional coil patterns from among wireless power charging (WPC), near field wireless communication (NFC), and magnetic security transmission (MST) coil patterns.

BACKGROUND ART

Near field communication (NFC) is one type of radio frequency identification (RFID) technology through which various wireless data is transmitted and received within a short distance of about 10 cm and is a non-contact communication technology using a frequency band of 13.56 MHz. Since a communication distance of the NFC is short, security is relatively high, and a cost is cheap, and thus the NFC is spotlighted as a short distance communication technology. Since data may be read and written using the NFC, there is an advantage in that a dongle (reader) needed for using a conventional RFID is not necessary.

Meanwhile, a technology for converting electrical energy into an electromagnetic wave capable of being wirelessly transmitted and transmitting the electromagnetic wave is referred to as a wireless power transmission or wireless power charge (WPC) technology, and the WPC technology is divided into an electromagnetic induction type WPC technology, a magnetic resonance type WPC technology, and the like according to an implementation method, and the electromagnetic induction type WPC technology has already been commercialized and standardized.

Specifically, the electromagnetic induction type WPC is operated according to a principle in which a current is applied to a power transmission coil to induce a magnetic field, and the magnetic field which is changed depending on time induces the power transmission coil to generate a current again to supply electric charges to a battery connected to the power transmission coil. The WPC technology has a very high power transmission efficiency of 90% or more, is not harmful to a human body, and may be widely applied to any technology from a device which needs small amounts of power, such as a smartphone, to a device which needs large amounts of power such as an electric vehicle.

In addition, a magnetic secure transmission (MST) technology recently becoming an issue with regards to credit card linked payment of a smartphone is a technology in which, when a mobile device having credit card information is moved adjacent to a credit card payment terminal, the terminal may automatically read the credit card information and payment may be performed. Since payment is performed by wirelessly transmitting the information of the magnetic credit card, the MST technology has an advantage of not using the above-described NFC technology.

Electromagnetic waves (or radiation noise) generated by electronic devices having functions, such as a variety of wireless communications, power transmission and reception, data transmission and reception, and the like described above, may have negative influences in which malfunctions of peripheral electronic devices occur and health of a user is damaged when a human body is exposed to the electromagnetic waves. Accordingly, in order to shield an electromagnetic wave generated by an electronic device and suppress an eddy current, an electromagnetic wave shielding sheet formed of magnetic materials, such as a ferrite, is mounted on and used in an antenna module.

A shield cap is formed above a circuit module installed in a mobile communication terminal, and when an electromagnetic wave shield body is formed by forming a ferrite sheet composite body on the shield cap, an electromagnetic wave generated by the circuit module may be efficiently shielded.

In addition, a magnetization direction of a magnetic material used for NFC, WPC, or MST has to be easily changed according to a phase shaft of an external alternate current electromagnetic field, and a magnetic wave phenomenally distributed in a space has to be moved to an inside of the magnetic material to form a magnetic circuit having a high density magnetic flux so that the magnetic material serves to shield the electromagnetic wave affecting a terminal body or battery.

Here, a magnetic permeability among properties of a magnetic material refers to a ratio of a magnetic flux density generated when the magnetic material is magnetized by being influenced by a magnetic field to a magnitude of a magnetic field in a vacuum, and since the magnetic permeability is an indicator for indicating a level to which a magnetic flux density may be increased, a magnetic material having a high magnetic permeability is required to minimize a magnetic field being leaked.

Furthermore, in mobile devices and the like, as various wireless power/data transmission and reception technologies are developed and include composite functions which are two or more functions, properties such as a magnetic permeability and a saturated magnetization value of a ferrite electromagnetic wave shielding sheet need to be optimized to easily perform corresponding functions.

SUMMARY

The present invention is directed to providing a composite ferrite magnetic field shielding sheet including ferrite sheets having raw ferrite particles having different shapes and optimized to form two or more functional coil patterns from among wireless power charging (WPC), near field wireless communication (NFC), and magnetic security transmission (MST) functional coil patterns, a method of manufacturing the same, and an antenna module using the same.

One aspect of the present invention provides a composite ferrite magnetic field shielding sheet (A) in which two or more functional coil patterns are formed, and the sheet includes a first magnetic sheet (10) including a first region (12) in which a first coil pattern (11) is formed, and a second magnetic sheet (20) including a second region (22) in which a second coil pattern (21) is formed, wherein a resonance frequency according to the first coil pattern (11) is lower than a resonance frequency according to the second coil pattern (21), magnetic permeability of the first region (12) is higher than that of the second region (22), the first magnetic sheet 10 and the second magnetic sheet 20 are ferrite sheets, and shapes of ferrite particles which are raw materials of the magnetic sheet (10) and the second magnetic sheet (20) are different.

The first coil pattern (11) may be a coil pattern for wireless power charge (WPC) or magnetic secure transmission (MST), and the second coil pattern (21) may be a coil pattern for near field communication (NFC).

The first magnetic sheet (10) may be formed to be smaller than the second magnetic sheet (20) and the first magnetic sheet (10) may be stacked on a central portion of an upper surface of the second magnetic sheet (20) or inserted into an opening portion (23) provided in the central portion of the upper surface of the second magnetic sheet (20).

A type of ferrite particles, which is a raw material of each of the first magnetic sheet (10) and the second magnetic sheet (20), may be one or more selected from the group consisting of a spherical type, a needle type, and a core-shell type.

The first magnetic sheet (10) or the second magnetic sheet (20) may be a needle type ferrite sheet including needle type ferrite particles having a magnetic direction oriented in one direction.

The first magnetic sheet (10) or second magnetic sheet (20) may be a core-shell type ferrite sheet including core-shell type ferrite particles having a core portion formed of a metal material and a shell portion formed of a Ni—Zn-based ferrite material, and an oxide of the metal material forming the core portion may be formed on a surface of the core portion.

The first magnetic sheet (10) may include core-shell type ferrite particles, and the second magnetic sheet (20) may include needle type ferrite particles or spherical ferrite particles.

The first magnetic sheet (10) may include needle type ferrite particles, and the second magnetic sheet (20) may include spherical ferrite particles.

Another aspect of the present invention provides an antenna module including the composite ferrite magnetic field shielding sheet (A) in which a coil pattern for wireless power charging (WPC) or magnetic security transmission (MST) is formed as a first coil pattern (11) and a coil pattern for near field communication (NFC) is formed as a second coil pattern (21).

The composite ferrite magnetic field shielding sheet (A) may be fractured into a plurality of pieces.

Still another aspect of the present invention provides a method of manufacturing a composite ferrite magnetic field shielding sheet in which two or more functional coil patterns are formed, and the method includes the steps of: (a) manufacturing a first green sheet (10') and a second green sheet (20') in order to manufacture a first magnetic sheet (10) including a first region (12) in which a first coil pattern (11) is formed and a second magnetic sheet (20) including a second region (22) in which a second coil pattern (21) is formed; and (b) simultaneously sintering the first green sheet (10') and the second green sheet (20') to manufacture a composite ferrite magnetic field shielding sheet (A) in which the first magnetic sheet (10) and the second magnetic sheet (20) are coupled, wherein a resonance frequency according to the first coil pattern (11) is lower than a resonance frequency according to the second coil pattern (21), a magnetic permeability of the first region (12) is higher than that of the second region (22), the first magnetic sheet (10) and the second magnetic sheet (20) are ferrite sheets, and shapes of ferrite particles which are raw materials of the magnetic sheet (10) and the second magnetic sheet (20) are different.

The first coil pattern (11) may be a coil pattern for wireless power charge (WPC) or magnetic secure transmission (MST), and the second coil pattern (21) is a coil pattern for near field communication (NFC).

In the step (a), the first green sheet (10') may be formed to be smaller than the second green sheet (20'), and the first green sheet (10') may be stacked on a central portion of an upper surface of the second green sheet (20') or inserted into an opening portion (23) provided in the upper surface of the second green sheet (20').

A type of ferrite particles, which is a raw material of each of the first magnetic sheet (10) and the second magnetic sheet (20), may be one or more selected from the group consisting of a spherical type, a needle type, and a core-shell type.

The first magnetic sheet (10) or the second magnetic sheet (20) may be a needle type ferrite sheet, and a magnetic field may be applied to the first magnetic sheet (10) and the second magnetic sheet (20) during the step (a) of manufacturing green sheets including needle type ferrite particles, before the step (b), or during the step (b) such that magnetic directions of the needle type ferrite particles are oriented in one direction.

The first magnetic sheet (10) or second magnetic sheet (20) may be a core-shell type ferrite sheet, and the method may further include, before the step (a), forming a core portion formed of a metal material by reducing a metal oxide, forming a shell portion by epitaxially growing a Ni—Zn-based ferrite on a surface of the core portion, and oxidizing a metal forming the core portion to form an oxide on the surface of the core portion after the forming of the core portion.

The step (a) may include forming the second green sheet (20') on a carrier film (30), forming the first green sheet (10') on the second green sheet (20'), and delaminating the carrier film (30) from the second green sheet (20').

The step (a) may include forming the second green sheet (20') on a carrier film (30) such that an opening portion (23) is provided in a central portion of the second green sheet (20'), forming the first green sheet (10') configured to be inserted into the opening portion (23), and delaminating the carrier film (30).

The method may further include, after the step (b), attaching a protective film (40) to at least one surface of the composite ferrite magnetic field shielding sheet (A), and fracturing the composite ferrite magnetic field shielding sheet (A) into a plurality of pieces.

The composite ferrite magnetic field shielding sheet, a manufacturing method of the same, and an antenna module using the same of the present invention has an effect that sheet materials are adjusted to form different regions in which different functional coils are formed in one composite ferrite sheet so as to easily adjust a magnetic permeability, a saturated magnetization value, a thickness, a density of a sintered sheet, a degree of orientation of particles, a composition of a raw material, a volume ratio of a core portion to a shell portion, and the like such that corresponding functions are optimized.

DETAILED DESCRIPTION

Figure 1:
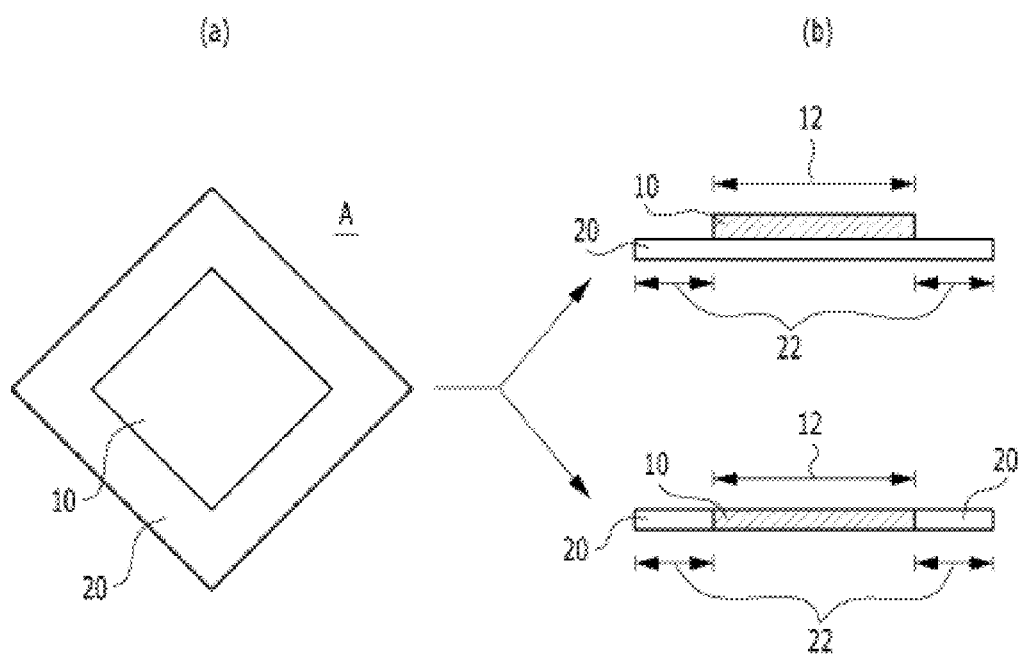
FIG. 1 includes a perspective view (a) illustrating a composite ferrite magnetic field shielding sheet (A) according to an exemplary embodiment of the present invention, and cross-sectional views (b) illustrating two types of examples.

Hereinafter, exemplary embodiments of the present invention will be described in detail with reference to the accompanying drawings. Terms and words used in this specification and claims are not to be interpreted as limited to commonly used meanings or meanings in dictionaries and should be interpreted with meanings and concepts which are consistent with the technological scope of the invention Throughout the specification, when a member is referred to as being "on" another member, the member is in contact with another member or, yet another member is interposed between two members.

Throughout this specification, when a certain part "includes" a certain component, it means that another component may be further included and not excluding another component unless otherwise defined.

The terms first, second, etc. are used to distinguish one component from another, and a scope of the present invention is not limited by the terms. For example, a first element may be referred to as a second element, and similarly, the second element may also be referred to as the first element.

Reference numerals in operations are used for the sake of convenience in description and do not describe an order of the operations, and the operations may be performed through an order different from the described order unless the context clearly indicates a specific order. That is, the operations may be performed in the described order, but may also be performed at the same time, and may also be performed in the reverse order.

First, the present invention provides a composite ferrite magnetic field shielding sheet A including a first magnetic sheet 10 and a second magnetic sheet 20 in which a first region 12 and a second region 22 are formed, respectively, such that two or more functional coil patterns are formed according to one exemplary embodiment.

Figure 2:
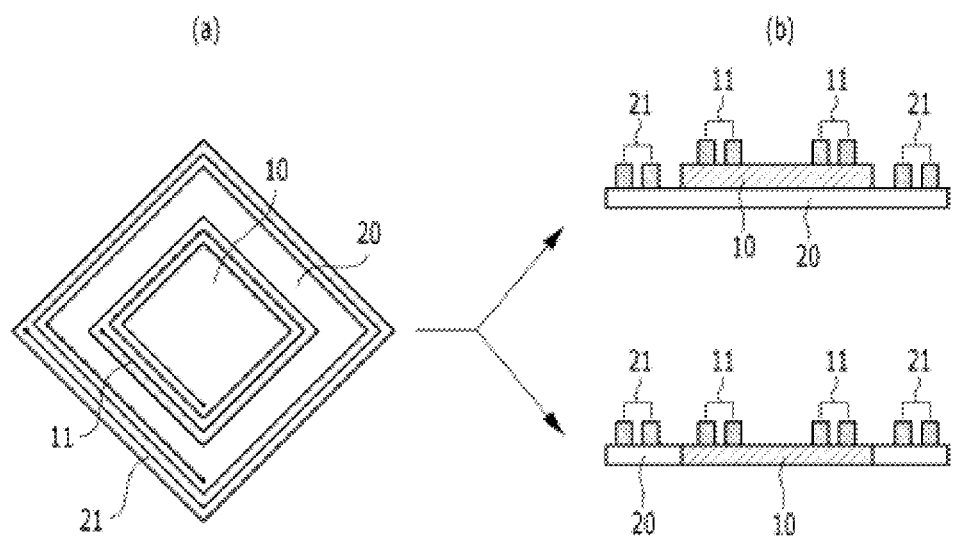
FIG. 2 includes a perspective view (a) illustrating the composite ferrite magnetic field shielding sheet (A) in which coil patterns are formed according to the exemplary embodiment of the present invention, and cross-sectional views (b) illustrating two types of embodiments.

FIG. 1 includes a perspective view (a) illustrating a composite ferrite magnetic field shielding sheet A according to an exemplary embodiment of the present invention, and cross-sectional views (b) illustrating two types of embodiments. FIG. 2 includes a perspective view (a) illustrating the composite ferrite magnetic field shielding sheet A in which coil patterns are formed according to the exemplary embodiment of the present invention, and cross-sectional views (b) illustrating two types of examples.

A 'functional coil pattern' in the present invention refers to one or more coil patterns selected from the group consisting of a coil pattern for wireless power charge (WPC), a coil pattern for magnetic secure transmission (MST), and a coil pattern for near field communication (NFC).

A resonance frequency according to a first coil pattern 11 patterned in the first region 12 may be lower than that of a second coil pattern 21 patterned in the second region 22. Preferably, the first coil pattern 11 may be a coil pattern for WPC or MST having a resonance frequency of about 100 KHz and 125 KHz, and the second coil pattern 21 may be a coil pattern for NFC having a resonance frequency of 13.56 MHz.

A magnetic permeability of a sheet region corresponding to the first region 12 of the composite ferrite sheet is preferably greater than that of a sheet region corresponding to the second region 22 and a saturated magnetization value of the sheet region corresponding to the first region 12 is preferably greater than that of the sheet region corresponding to the second region 22 to form coil patterns having different functions and resonance frequency bands in the divided regions and harmoniously perform the different functions. Particularly, in the case of a type in which a permanent magnet is installed at a power transmission side (Tx side) for WPC, a saturated magnetization value of a sheet formed at a power reception side (Rx side) has to be high to obtain a sufficient charge efficiency.

To adjust magnetic permeabilities or saturated magnetization values of the divided regions to be different, the present invention is mainly characterized by adjusting shapes of ferrite particles which are row materials of the ferrite sheet, and specifically, the materials are adjusted to be differently formed between the regions.

More specifically, a type of ferrite particles which are a row material of each of the first magnetic sheet 10 and the second magnetic sheet 20 may be at least one or more selected from the group consisting of needle type ferrite particles and core-shell type ferrite particles, and the composite ferrite magnetic field shielding sheet A may have a type in which a ferrite sheet formed of one of the above two types is combined with a ferrite sheet formed of a general spherical particles.

Figure 5:
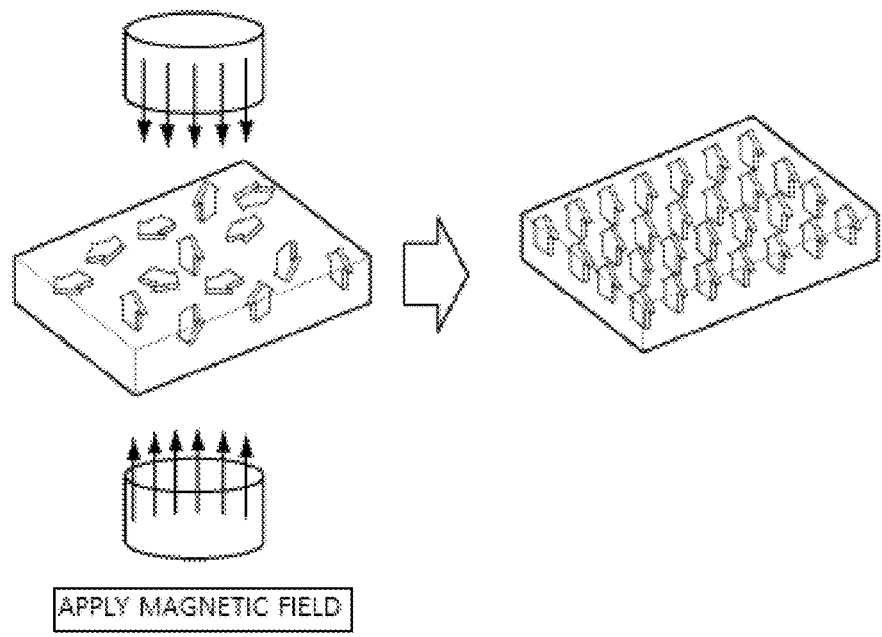
FIG. 5 is a schematic view illustrating a magnetic field application process during a manufacturing process of a needle type ferrite sheet according to an exemplary embodiment of the present invention.
Figure 6:
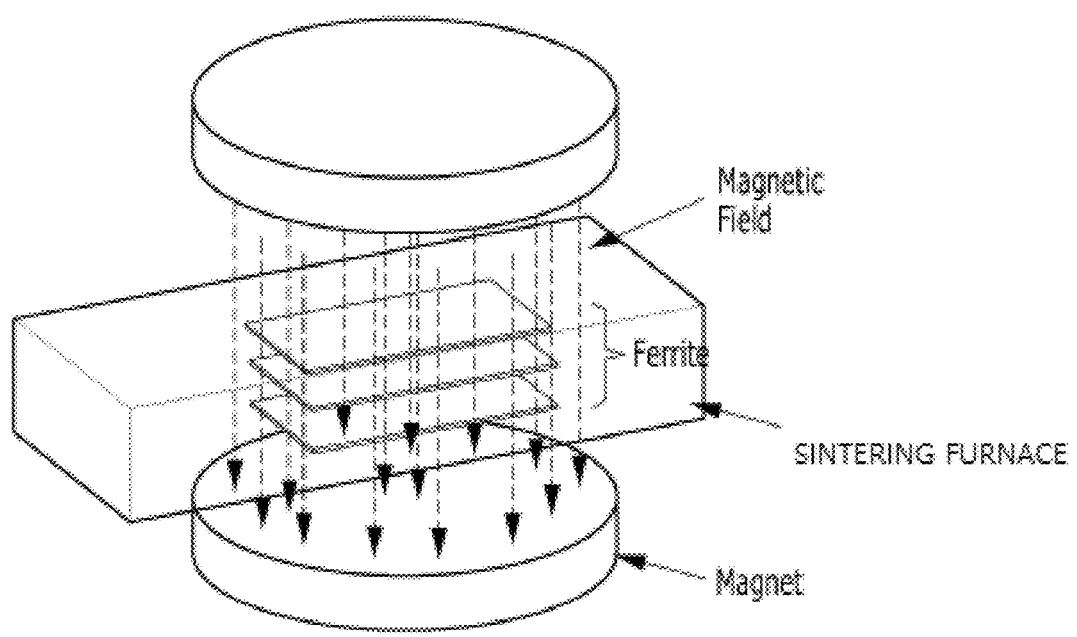
FIG. 6 is a schematic view illustrating a process in which a magnetic field application process and a sintering process are performed at the same time during the manufacturing process of the needle type ferrite sheet according to the exemplary embodiment of the present invention.

First, in the case of the needle type ferrite sheet illustrated in FIGS. 5 and 6, the sheet may include needle type ferrite particles having a magnetic direction oriented in one direction. The needle type ferrite particles may be at least one selected from a type of hard ferrite particles and a type of soft ferrite particles, and soft ferrite may be at least one of oxidative soft ferrites such as a Ni—Zn-based ferrite, a Ni—Zn—Cu-based ferrite, a Mn—Zn-based ferrite, a Mg—Zn-based ferrite, and a Ni—Mn—Zn-based ferrite.

The needle type ferrite particles may be manufactured through various methods such as a solid phase method, a coprecipitation method, a sol-gel method, a hydrothermal synthesis method, but are not limited thereto, and may be manufactured through various known methods.

A needle type ferrite sheet is manufactured by using needle type particles, and by applying a magnetic field to the needle type particles in a manufacturing process such that the needle type particles are oriented in one direction, a magnetic permeability value of the needle type ferrite sheet can be significantly increased in comparison to a sheet using conventional spherical ferrite particles, and thus a shield effect can be maximized and power efficiency of an electronic device can be increased.

The needle type ferrite sheet may be controlled such that a magnetic permeability is in a range of 100 to 5000 within a frequency band of 100 KHz to 30 MHz and may be applied to a shielding sheet suitable for WPC, MST, and NFC due to the above-described property.

Although a thickness of the needle type ferrite sheet is not particularly limited, adjusting the thickness to be in a range of 10 to 200 μm is suitable in view of applications to mobile electronic devices.

In the composite ferrite magnetic field shielding sheet A of the present invention, the above-described needle type ferrite sheet may be applied to any one or more of the first magnetic sheet 10 and the second magnetic sheet 20, and an extent of orientation of the needle type particles, a composition of a particle material, a density of sintered particles, and a ratio of a major axis of the needle type particle may be adjusted to satisfy properties such as a magnetic permeability of a corresponding region. For example, as an extent of orientation or a ratio of a major axis of the needle type particle is increased, a magnetic permeability value of a sheet region in which the needle type ferrite sheet is applied may be increased.

Figure 7:
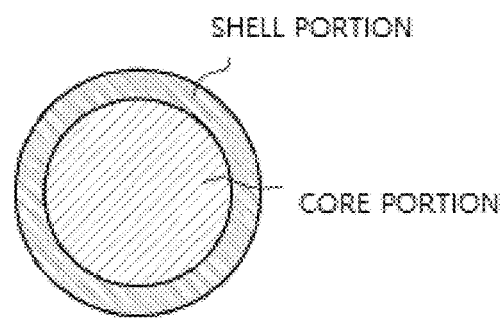
FIG. 7 is a schematic view showing a cross-section of a core-shell type ferrite particle according to an exemplary embodiment of the present invention core.
Figure 8:
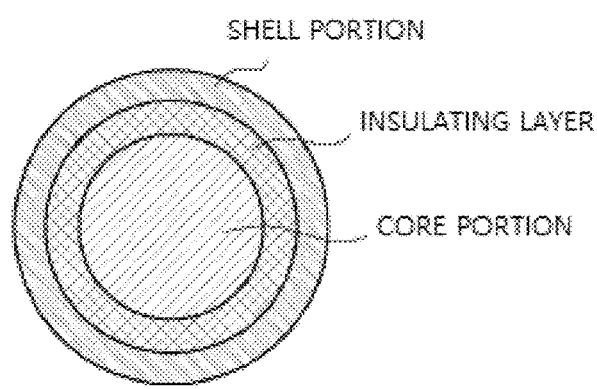
FIG. 8 is a schematic view showing a cross-section of a core-shell type ferrite particle according to another exemplary embodiment of the present invention core.
Figure 9:
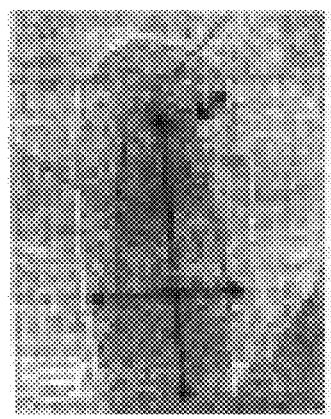
FIG. 9 is an image of a transmission electron microscope (TEM) showing the core-shell type ferrite particle according to the exemplary embodiment of the present invention.

Next, first, in the case of a core-shell type ferrite sheet as illustrated in FIGS. 7 to 9, the sheet may include core-shell type ferrite particles each including a core portion formed of a metal material and a shell portion formed of a Ni—Zn-based ferrite material surrounding the core portion.

The core portion formed of the metal material of the core-shell type particle functions to exhibit a high magnetic permeability and a high resistance. Various metals known in the corresponding field may be used as the core portion, and, for example, alpha iron ($\alpha$-Fe), an alloy containing $\alpha$-Fe, or the like may be used. In a case in which a metal material containing $\alpha$-Fe is used, it is preferable in that a property of a high magnetic permeability may be obtained and performance degradation due to eddy current loss is minimized.

A size of the core portion is not particularly limited and may be selected in consideration of a range of a particle generally used in the corresponding field. For example, an average length of a main axis of the core portion may be in a range of 50 to 500 nm. In the case in which an average length of a main axis of a metal magnetic particle satisfies the above-described range, a problem of a magnetic property loss (superparamagnetic problem) due to pulverization may be prevented, and more preferably, the average length may be in a range of 50 to 300 nm. In addition, in a case in which a geometrical magnetic anisotropy is required, since an axis ratio (main axis/minor axis) is also an important factor, it is preferable that the axis ratio be two or more.

The core portion may be included in the entire core-shell type particle at 30 to 70 vol %. When the core portion is included in the particle at less than 30 vol %, a magnetic permeability and a saturated magnetization value of the particle may not be significantly increased, and when the core portion is included in the particle at more than 70 vol %, there is a problem in that stability of the particle is reduced.

Meanwhile, as illustrated in FIG. 8, an insulating layer may be formed on a surface of the core portion. The insulating layer serves to supply a coupling force such that the shell portion is stably coupled to the outer circumferential surface of the core portion and suppresses a reverse current flow when the core portion comes into contact with an electromagnetic wave to minimize eddy current loss.

The insulating layer may be a layer formed of various insulating materials known to a corresponding technical field. The insulating layer may preferably be an oxidation layer, and more preferably, may be an oxide layer formed of a metal material of the core portion in view of increasing a process yield through convenience of a manufacturing process.

A thickness of the insulating layer is not particularly limited, but it is preferable that the thickness be in a range of 2 to 20 nm, when the thickness of the insulating layer is less than 2 nm, there is problems in that a coupling force between the shell portion and the core portion is reduced and oxidation stability of a powder is reduced, and when the thickness is greater than 20 nm, there is a problem in that magnetic properties are reduced. Accordingly, it is more preferable that the thickness range from 5 to 20 nm.

A Ni—Zn-based ferrite having a soft magnetism in which a magnetic permeability is high, and a loss is low may be used as the shell portion. Specifically, a ferrite having a molar ratio of Ni/Zn of 0.3 to 0.9 may be used in the shell portion, when a molar ratio of the Ni/Zn is less than 0.3, there is a problem in that the shell portion is insufficient to exhibit magnetic properties, and when a molar ratio of the Ni/Zn is greater than 0.9, there is a problem in that a magnetic permeability is dramatically reduced. Thus, it is more preferable that a molar ratio of the Ni/Zn is limited within a range from 0.4 to 0.7.

In addition, the Ni/Zn ferrite included in the shell portion may further include an additional metal material. For example, copper, cobalt, and the like may be further added to the Ni/Zn ferrite. The shell portion is formed on the surface of the core portion and a thickness of the shell portion has to be suitable according to a size of the core portion, and, for example, the thickness may be in a range of 10 to 100 nm. When a thickness of the shell portion is less than 10 nm, there is a problem in that high frequency properties of a magnetic particle may not be sufficiently realized, and when a thickness thereof is greater than 100 nm, there is a problem in that a property of a magnetic permeability of the magnetic particle is significantly reduced.

Although a ratio of occupation of the shell portion in the entire ferrite particle is not particularly limited, the shell portion may be preferably included in the entire ferrite particle at a ratio of 30 to 70 vol %. When the shell portion is included in the particle at less than 30 vol %, there is a problem in that high frequency properties of the magnetic particle may not be sufficiently realized, and when the shell portion is included in the particle at greater than 70 vol %, there is a problem in that a property of a magnetic permeability of the composite magnetic particle is reduced.

In the composite ferrite magnetic field shielding sheet A, the above-described core-shell type ferrite sheet may be applied to any one or more of the first magnetic sheet 10 and the second magnetic sheet 20, and a volume/size ratio between the core portion and the shell portion, a composition of a particle material, a density of sintered particles, a ratio of a major axis of the needle type particle may be adjusted to satisfy properties such as a magnetic permeability and a saturated magnetization value in a corresponding region. For example, as a density of sintered particles is increased, a magnetic permeability may be increased, and as a volume ratio of the core portion in the particle, a saturated magnetization property may be increased.

As described above, the main technical spirit of the present invention is that any one of the needle type ferrite sheet, the core-shell type ferrite sheet, and a general spherical ferrite sheet is adopted for each of the first magnetic sheet 10 and the second magnetic sheet 20, and parameters related to the ferrite materials forming the first magnetic sheet 10 and the second magnetic sheet 20 are controlled to obtain properties (a magnetic permeability, a saturated magnetization value, and the like) of levels suitable for the functions of the first magnetic sheet 10 and the second magnetic sheet 20.

As one exemplary embodiment, the first magnetic sheet 10 may be a sheet formed of the core-shell type ferrite particles, and the second magnetic sheet 20 may be a sheet formed of the needle type ferrite particles or spherical ferrite particles.

In addition, as another exemplary embodiment, a first magnetic sheet 10 may be a sheet formed of needle type ferrite particles, and a second magnetic sheet 20 may be formed of spherical ferrite particles.

Next, a structural form of the composite ferrite magnetic field shielding sheet A will be described.

A composite sheet including the first magnetic sheet 10 and the second magnetic sheet 20 of the present invention may include the first region 12 formed at the central portion thereof and the second region 22 formed at an edged thereof as illustrated in FIG. 1. The first region 12 of the central portion may be a region in which the first magnetic sheet 10 overlaps and is stacked on an upper portion of the second magnetic sheet 20 like an upper example of (b) of FIG. 1, or may be a region formed with only the first magnetic sheet 10 by inserting the first magnetic sheet 10 into an opening portion 23 provided at the central portion of the second magnetic sheet 20 like a lower example of (b) of FIG. 1. FIG. 2 is views illustrating a first coil pattern 11 and a second coil pattern 21 patterned in the first region 12 and the second region 22, respectively. Among the two types illustrated in (b) of FIG. 1 and (b) of FIG. 2, a type of the composite sheet in which the first magnetic sheet 10 is inserted into the opening portion 23 of the second magnetic sheet 20 is preferable because a thickness of the composite sheet may be minimized, and a manufacturing cost may also be reduced.

Next, a manufacturing method of the composite ferrite magnetic field shielding sheet A will be described.

A manufacturing method of the present invention mainly includes an operation (a) of manufacturing a first green sheet 10' and a second green sheet 20', and an operation (b) of simultaneously sintering the first green sheet 10' and the second green sheet 20' and manufacturing the composite sheet A in which the first green sheet 10' and the second green sheet 20' are coupled.

As described above, a structure of the composite sheet is mainly divided into a form in which two sheets are stacked and a form in which a sheet is inserted into an opening portion formed in another relatively large sheet. After each of the separate sheets are sintered individually like a conventional sheet manufacturing process, (i) when the two sheets are attached by a bonding tape, there are problems in that a space may be formed between the sheets and a total thickness of the composite sheet may be increased, and (ii) when one sintered sheet is punched to form an opening portion and the remaining sintered sheet is inserted into and disposed in the opening portion, there are also problems in that a space may be formed between the sheets, a sheet region of a punched portion has to be scrapped and thus a process yield is reduced.

Accordingly, the manufacturing process of the present invention may solve the above-described problems through a method in which a form of the composite sheet is formed first in a green sheet manufacturing process and the two sheets of the composite sheet are simultaneously sintered. Specifically, since there are no spaces between the first magnetic sheet 10 and the second magnetic sheet 20 which are finally sintered, and the opening portion is formed in the green sheet state, a scrap generated during the formation of the opening portion may be recycled, and thus a process yield may be increased.

Figure 3:
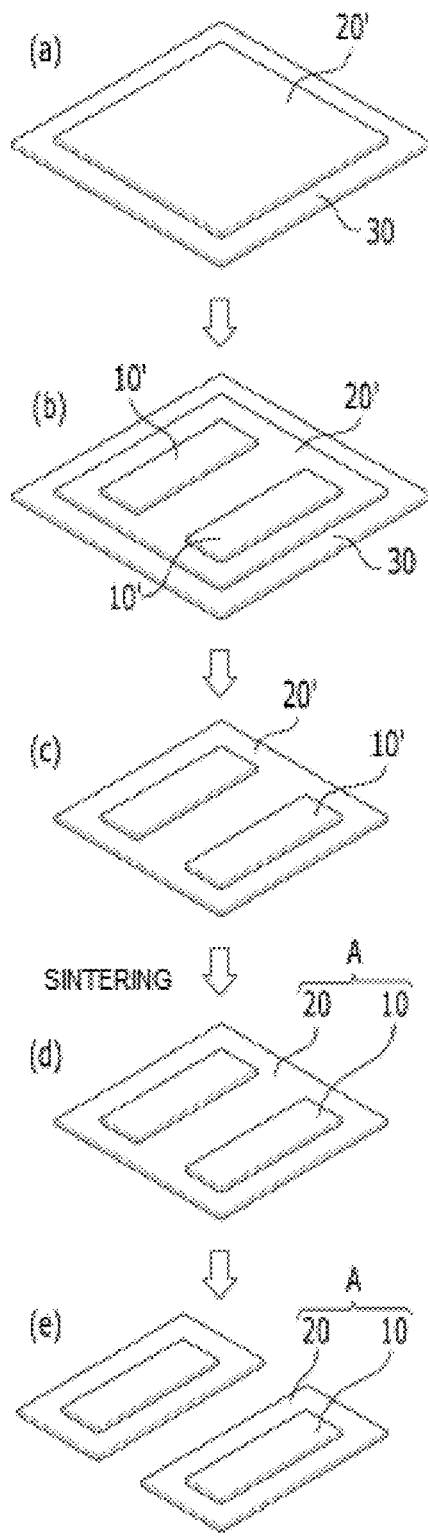
FIG. 3 is a schematic view illustrating a manufacturing process of the composite ferrite magnetic field shielding sheet (A) according to the exemplary embodiment of the present invention.

Specifically, as illustrated in FIG. 3, the second green sheet 20' is formed first on one surface of a carrier film 30, the first green sheet 10' is formed on an upper surface of the second green sheet 20', the carrier film 30 is removed therefrom, and the first green sheet 10' and the second green sheet 20' are simultaneously sintered to completely form the composite sheet A in which the first magnetic sheet 10 is stacked on the upper surface of the second magnetic sheet 20.

Figure 4:
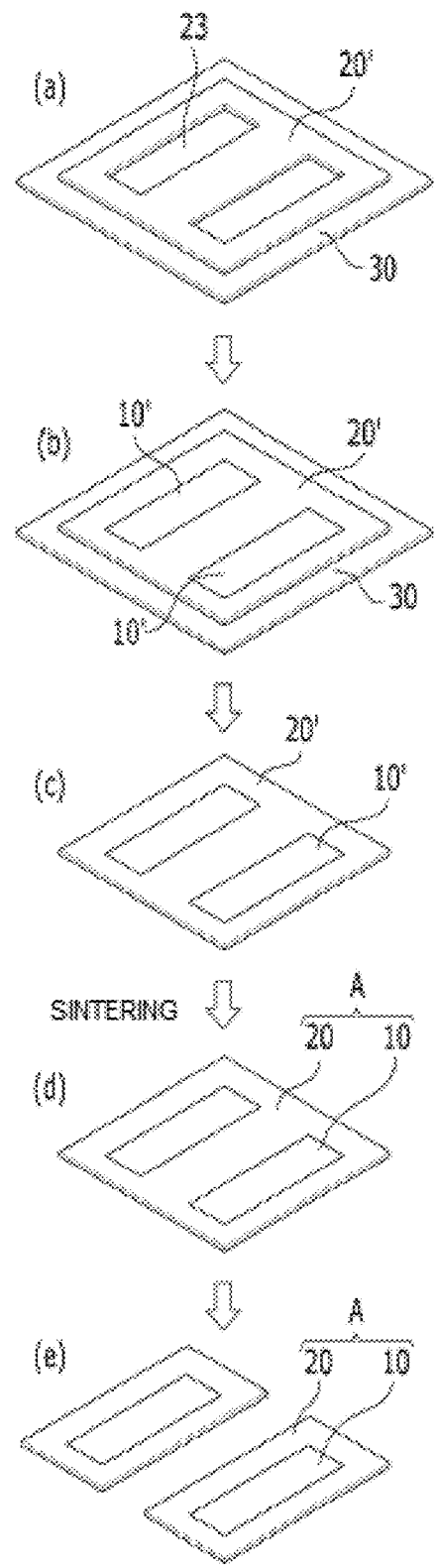
FIG. 4 is a schematic view illustrating a manufacturing process of a composite ferrite magnetic field shielding sheet (A) according to another exemplary embodiment of the present invention.

In addition, as illustrated in FIG. 4, the second green sheet 20' in which the opening portion 23 is formed by being punched is formed first on the one surface of the carrier film 30, the first green sheet 10' is inserted into and disposed in the opening portion 23, the carrier film 30 is removed therefrom, and the first green sheet 10' and the second green sheet 20' are simultaneously sintered to completely manufacture the composite sheet A having a form in which the first magnetic sheet 10 is inserted into and coupled to the opening portion 23 of the second magnetic sheet 20.

In addition, a protective film 40 may be attached to at least one surface of the completely manufactured composite sheet A to provide adhesive properties thereto so as to protect the surface of the sheet or to be attached to an electronic device, and a post process in which the composite sheet A is fractured into a plurality of pieces may be performed to realize a flexible property after the protective film 40 is attached thereto.

Specifically, after the protective film 40 is attached thereto, when the composite ferrite magnetic field shielding sheet A is pressed at a predetermined pressure, a plurality of cracks are formed on an entire surface of the sheet so that the sheet is fractured into the plurality of pieces. Here, since a form of the composite sheet A is maintained by the protective film 40, the pieces of the fractured sheet are separated in the composite sheet A, but a state in which the pieces are adjacent to each other is maintained. Accordingly, the composite sheet A has a constant flexibility due to the fractured sheet pieces which are internally present.

Example 1

<Manufacturing of Needle Type Ferrite Sheet>

The needle type ferrite sheet may be manufactured through a process of forming a sheet by applying a prepared slurry on the carrier film 30, wherein the slurry is for manufacturing a sheet including raw ferrite particles (powder) having a needle type structure.

First, the slurry for manufacturing the sheet may be prepared by adding a solvent and a bonding agent to a needle type ferrite powder, and any material generally used in the corresponding technical field may be used in the solvent and the bonding agent without particular limitations.

The slurry for manufacturing the sheet may be applied on the carrier film 30 using a coating method, such as a doctor blade coating method, a slit coating method, a knife coating method, a spin coating method, a casting method, a micro gravure coating method, a gravure coating method, a bar coating method, a roll coating method, a wire coating method, a deep coating method, a spray coating method, a nozzle coating method, or a capillary coating method, or a printing method, such as a screen printing method, a gravure printing method, a flexo printing method, an offset printing method, an inkjet printing method, or a dispenser printing method, but is not limited thereto.

The needle type ferrite particles are oriented in one direction due to a magnetic anisotropic property through a magnetic field application process, and thus a magnetic permeability value may be significantly increased.

FIG. 5 is a schematic view illustrating a magnetic field application process during a manufacturing process of a needle type ferrite sheet according to an exemplary embodiment of the present invention. The magnetic field application process may be performed by placing magnets below and above the sheet.

The magnetic field application process and a green sheet manufacturing process (a sheet forming process) may be simultaneously performed, or the magnetic field application process may be performed after the green sheet manufacturing process, or the magnetic field application process and a green sheet sintering process may be simultaneously performed during the green sheet manufacturing process, and it is preferable that the magnetic field be applied on the sheet after the green sheet is formed and before the solvent is volatilized in order to improve one directional orientation of a magnetic direction.

A magnitude of a magnetic field required in the magnetic field application process is not particularly limited, and the magnetic field application process may be performed with a degree of magnitude that orients magnetic directions of the sheet in one direction such that a desired magnetic permeability value is obtained.

Then, the magnetic direction oriented in one direction is fixed through the sintering process and the orientation is maintained without changing even under a condition in which a magnetic field is not applied, and, as described above and illustrated in FIG. 6, the magnetic field application process and the sintering process may also be performed simultaneously. Specifically, after the sheet is loaded into a sintering furnace, magnets may be disposed above and below the sintering furnace to perform the magnetic field application process.

A condition of the sintering process is not particularly limited, and for example, the sintering process may be performed at a temperature ranging from 800 to 1000° C., and may be performed at a suitable temperature range selected according to a composition of the needle type ferrite particles and a process condition thereof. In a case in which sintering is performed at the above-described range, an orientation of the magnetic direction based on the magnetic field application may be more improved.

Example 2

<Manufacturing of Core-Shell Type Ferrite Sheet>
The core-shell ferrite material may be manufactured.

First, the core portion having a metal material is formed by reducing a metal oxide. Any oxide selected from materials known in the corresponding field may be used as the metal oxide. For example, hematite, magnetite, goethite, or the like may be used as the core portion. Among them, the magnetite may be manufactured by oxidizing a ferrous solution under a condition of a temperature of 70 to 90° C., pH of 7 to 8, and aeration.

The metal core portion may be formed by reducing a prepared metal oxide through a method known in a corresponding field. A reducing method may be performed using a method selected from a dry reducing method and wet reducing method, and it is preferable that the dry reducing method be used in view of decreasing a reaction time and improving reduction reproducibility. Wet reduction is performed in a solution containing an amine group, an aldehyde group, or the like, and in the case of pure iron, since a reduction potential is high and re-oxidation occurs easily, it is not easy to stably progress a desired reduction reaction with the wet reducing method. As an exemplary embodiment, the metal core portion may be formed by reducing a metal oxide through a dry reducing method using an air flow layer under a hydrogen atmosphere.

Then, the insulating layer is formed on the formed metal core portion, and the Ni—Zn-based ferrite shell portion is formed. A forming method of the shell portion is not particularly limited, and for example, the shell portion may be formed by epitaxially growing a Ni—Zn-based ferrite on the surface of the core portion. More specifically, the forming method may be performed by forming an interface having a spinel structure in the core portion and growing the Ni—Zn-based ferrite having the same crystal structure as the interface. The epitaxial growth of the Ni—Zn-based ferrite may be performed by adding water to a core portion dispersed liquid in advance, and dropping a Ni—Zn-based ferrite solution thereon or dropping water on a solution in which the core portion and the Ni—Zn-based ferrite are present together. As an exemplary embodiment, the shell portion may be formed on the core portion through a method in which the water is added to the core portion dispersed liquid and the Ni—Zn-based ferrite solution is dropped thereon.

The shell portion may be formed to satisfy the above-described thickness and a volume ratio thereof to the core portion, and forming of the shell portion may be controlled by adjusting a reaction time during which the shell portion is grown from the surface of the core portion.

The core portion may further include the insulating layer formed on the surface thereof, and in the case in which the insulating layer is formed, an operation in which the insulating layer is formed on the surface of the core portion has to be performed before the above-described shell portion is formed.

Although the insulating layer may be formed of an insulating material known in a corresponding field through a known method, the insulating layer may be formed by oxidizing the surface of the core portion in view of improving process efficiency because the insulating layer is simply formed without an additional material or process.

A method of oxidizing the surface of the core portion is not particularly limited, but may preferably be performed by slowly oxidizing the surface of the core portion under an oxygen-partial pressure of 10 to 100 mmHg, and a thickness of the formed insulating layer may be controlled by adjusting a reaction time.

As described above, the composite ferrite magnetic field shielding sheet, the manufacturing method of the same, and an antenna module using the same of the present invention have an effect that sheet materials are adjusted to form different regions, in which different functional coils are patterned, in one composite ferrite sheet so as to easily adjust a magnetic permeability, a saturated magnetization value, a thickness, a density of a sintered sheet, a degree of orientation of particles, a composition of a raw material, a volume ratio of a core portion to a shell portion, and the like such that corresponding functions are optimized.

The present invention is not limited to the above-described specific embodiment and descriptions, and may be variously made by those skilled in the art without departing from the gist of the present invention claimed by appended claims, and the modifications fall within the protection scope.

The invention claimed is:

1. A composite ferrite magnetic field shielding sheet in which two or more functional coil patterns are formed, the sheet comprising:
    a first magnetic sheet including a first region in which a first coil pattern is formed; and
    a second magnetic sheet including a second region in which a second coil pattern is formed,
    wherein a resonance frequency according to the first coil pattern is lower than a resonance frequency according to the second coil pattern, and magnetic permeability of the first region is higher than that of the second region, and
    wherein the first magnetic sheet and the second magnetic sheet are ferrite sheets, and shapes of ferrite particles which are raw materials of the magnetic sheet and the second magnetic sheet are different.

2. The sheet of claim 1, wherein:
    the first coil pattern is a coil pattern for wireless power charge (WPC) or magnetic secure transmission (MST); and
    the second coil pattern is a coil pattern for near field communication (NFC).

3. The sheet of claim 1, wherein:
    the first magnetic sheet is formed to be smaller than the second magnetic sheet; and
    the first magnetic sheet is stacked on a central portion of an upper surface of the second magnetic sheet, or inserted into an opening portion provided in the central portion of the upper surface of the second magnetic sheet.

4. The sheet of claim 1, wherein a type of ferrite particles, which is a raw material of each of the first magnetic sheet and the second magnetic sheet, is one or more selected from the group consisting of a spherical type, a needle type, and a core-shell type.

5. The sheet of claim 4, wherein the first magnetic sheet or the second magnetic sheet is a needle type ferrite sheet including needle type ferrite particles having a magnetic direction oriented in one direction.

6. The sheet of claim 4, wherein the first magnetic sheet or second magnetic sheet is a core-shell type ferrite sheet including core-shell type ferrite particles having a core portion formed of a metal material and a shell portion formed of a Ni—Zn-based ferrite material.

7. The sheet of claim 6, wherein an oxide of the metal material forming the core portion is formed on a surface of the core portion.

8. The sheet of claim 4, wherein:
    the first magnetic sheet includes core-shell type ferrite particles; and
    the second magnetic sheet includes needle type ferrite particles or spherical ferrite particles.

9. The sheet of claim 4, wherein:
    the first magnetic sheet includes needle type ferrite particles; and
    the second magnetic sheet includes spherical ferrite particles.

10. An antenna module comprising the composite ferrite magnetic field shielding sheet of claim 1, in which:
    a coil pattern for wireless power charging (WPC) or magnetic security transmission (MST) is formed as a first coil pattern; and
    a coil pattern for near field communication (NFC) is formed as a second coil pattern.

11. The antenna module of claim 10, wherein the composite ferrite magnetic field shielding sheet is fractured into a plurality of pieces.

12. A method of manufacturing a composite ferrite magnetic field shielding sheet in which two or more functional coil patterns are formed, the method comprising:
    (a) manufacturing a first green sheet and a second green sheet in order to manufacture a first magnetic sheet including a first region in which a first coil pattern is formed and a second magnetic sheet including a second region in which a second coil pattern is formed; and
    (b) simultaneously sintering the first green sheet and the second green sheet to manufacture a composite ferrite magnetic field shielding sheet in which the first magnetic sheet and the second magnetic sheet are coupled,
    wherein a resonance frequency according to the first coil pattern is lower than a resonance frequency according to the second coil pattern, and a magnetic permeability of the first region is higher than that of the second region, and
    wherein the first magnetic sheet and the second magnetic sheet are ferrite sheets, and shapes of ferrite particles which are raw materials of the magnetic sheet and the second magnetic sheet are different.

13. The method of claim 12, wherein:
    the first coil pattern is a coil pattern for wireless power charge (WPC) or magnetic secure transmission (MST); and
    the second coil pattern is a coil pattern for near field communication (NFC).

14. The method of claim 12, wherein, in the step (a):
    the first green sheet is formed to be smaller than the second green sheet; and
    the first green sheet is stacked on a central portion of an upper surface of the second green sheet or inserted into an opening portion provided in the upper surface of the second green sheet.

15. The method of claim 12, wherein a type of ferrite particles, which is a raw material of each of the first magnetic sheet and the second magnetic sheet, is one or more selected from the group consisting of a spherical type, a needle type, and a core-shell type.

16. The method of claim 15, wherein:
    the first magnetic sheet or the second magnetic sheet is a needle type ferrite sheet; and
    a magnetic field is applied to the first magnetic sheet and the second magnetic sheet during the step (a) of manufacturing green sheets including needle type ferrite particles, before the step (b), or during the step (b) such that magnetic directions of the needle type ferrite particles are oriented in one direction.

17. The method of claim 15, further comprising, before the step (a):

forming a core portion formed of a metal material by reducing a metal oxide; and forming a shell portion by epitaxially growing a Ni—Zn-based ferrite on a surface of the core portion, wherein the first magnetic sheet or second magnetic sheet is a core-shell type ferrite sheet.

18. The method of claim 17, further comprising, after the forming of the core portion, oxidizing a metal forming the core portion to form an oxide on the surface of the core portion.

19. The method of claim 12, wherein the step (a) includes:
forming the second green sheet on a carrier film;
forming the first green sheet on the second green sheet; and
delaminating the carrier film from the second green sheet.

20. The method of claim 12, wherein the step (a) includes:
forming the second green sheet on a carrier film such that an opening portion is provided in a central portion of the second green sheet;
forming the first green sheet to be inserted into the opening portion; and
delaminating the carrier film.

21. The method of claim 12, further comprising, after the step (b):
attaching a protective film to at least one surface of the composite ferrite magnetic field shielding sheet; and
fracturing the composite ferrite magnetic field shielding sheet into a plurality of pieces.

* * * * *